US011137452B2

(12) United States Patent
Deak et al.

(10) Patent No.: US 11,137,452 B2
(45) Date of Patent: Oct. 5, 2021

(54) SINGLE CHIP HIGH-SENSITIVITY MAGNETORESISTIVE LINEAR SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 98 days.

(21) Appl. No.: 16/610,623

(22) PCT Filed: May 3, 2018

(86) PCT No.: PCT/CN2018/085479
§ 371 (c)(1),
(2) Date: Nov. 4, 2019

(87) PCT Pub. No.: WO2018/202085
PCT Pub. Date: Nov. 8, 2018

(65) Prior Publication Data
US 2020/0174085 A1      Jun. 4, 2020

(30) Foreign Application Priority Data

May 4, 2017   (CN) .......................... 201710306939.4

(51) Int. Cl.
*G01R 33/00*   (2006.01)
*G01R 33/09*   (2006.01)

(52) U.S. Cl.
CPC ........ *G01R 33/0011* (2013.01); *G01R 33/093* (2013.01)

(58) Field of Classification Search
CPC ......................... G01R 33/0011; G01R 33/093
See application file for complete search history.

(56) References Cited

U.S. PATENT DOCUMENTS 7,982,461 B2    7/2011  Aiso
9,857,434 B2 *  1/2018  Deak ..................... G01R 33/09
(Continued)

FOREIGN PATENT DOCUMENTS

CN   101290343 A   10/2008
CN   102129863 A   7/2011
(Continued)

OTHER PUBLICATIONS

"International Application No. PCT/CN2018/085479, International Search Report and Written Opinion dated Jul. 5, 2018", (Jul. 5, 2018), 13 pgs.

*Primary Examiner* — Reena Aurora
(74) *Attorney, Agent, or Firm* — Schwegman Lundberg & Woessner, P.A.

(57) ABSTRACT

The present invention discloses a single-chip high-sensitivity magnetoresistive linear sensor, which comprises a substrate located in the X-Y plane and a soft ferromagnetic flux concentrator array located on the substrate. The soft ferromagnetic flux concentrator array comprises several soft ferromagnetic flux concentrators, wherein there is a gap between each two adjacent soft ferromagnetic flux concentrators. The +X and −X magnetoresistive sensing unit array respectively comprises +X and −X magnetoresistive sensing units located in the gaps. The +X and −X magnetoresistive sensing units are electrically interconnected to form a push pull X-axis magnetoresistive sensor. Each of the magnetoresistive sensing units that have the same magnetic field sensing direction are arranged in adjacent locations. The magnetoresistive sensing units are all MTJ magnetoresistive sensor elements, and each has the same magnetic multi-layer film structure. Laser magnetic annealing is used to scan and prepare the magnetic sensing array. The invention has the (Continued)

advantages of small size, high precision and low power consumption.

10 Claims, 8 Drawing Sheets

(56) References Cited

U.S. PATENT DOCUMENTS

| | | | |
|---|---|---|---|
| 9,885,764 | B2 | 2/2018 | Deak et al. |
| 10,473,449 | B2* | 11/2019 | Deak .................... G01R 33/093 |
| 2003/0062975 | A1 | 4/2003 | Kishi et al. |
| 2003/0094944 | A1* | 5/2003 | Suzuki ................. G01R 33/093 |
| | | | 324/252 |
| 2008/0297954 | A1 | 12/2008 | Aiso |
| 2011/0018531 | A1 | 1/2011 | Ishizaki |

FOREIGN PATENT DOCUMENTS

| | | |
|---|---|---|
| CN | 103630855 | 3/2014 |
| CN | 105044631 A | 11/2015 |
| CN | 106052725 A | 10/2016 |
| CN | 106324534 A | 1/2017 |
| CN | 206147081 U | 5/2017 |
| CN | 106871778 A | 6/2017 |
| CN | 107064829 A | 8/2017 |
| CN | 206627062 U | 11/2017 |
| CN | 206671519 U | 11/2017 |
| JP | 2011027495 A | 2/2011 |
| WO | WO-2018202085 A1 | 11/2018 |

\* cited by examiner

SINGLE CHIP HIGH-SENSITIVITY MAGNETORESISTIVE LINEAR SENSOR

PRIORITY CLAIM TO RELATED APPLICATIONS

This application is a U.S. national stage filing under 35 U.S.C. § 371 from International Application No. PCT/CN2018/085479, filed on 3 May 2018, and published as WO2018/202085 on 8 Nov. 2018, which claims the benefit under 35 U.S.C. 119 to Chinese Application No. 201710306939.4, filed on 4 May 2017, the benefit of priority of each of which is claimed herein, and which applications and publication are hereby incorporated herein by reference in their entirety.

TECHNICAL FIELD

The present invention relates to the field of magnetic sensors, and in particular, to a single-chip high-sensitivity magnetoresistive linear sensor.

BACKGROUND

In a high-sensitivity single-axis magnetoresistive linear sensor, the external magnetic field is amplified using a soft ferromagnetic flux concentrator, along with a push-pull bridge structure to enhance the signal output, which is a basic design for a high-sensitivity linear low-noise linear magnetoresistive sensor.

For a TMR magnetoresistive sensor, an X-axis push magnetoresistive sensing unit chip and an X-axis pull magnetoresistive sensing unit chip are obtained generally by flipping one of the magnetoresistive sensing unit chips with a magnetic field with X-axis sensing direction, by 180 degrees with respect to the other, in order to form a push-pull bridge. This is advantageous in that the manufacturing method is simple, and only one type of chip structure is required, and the process corresponds to setting the ferromagnetic reference layers of the structure to form a push-pull bridge. It is disadvantageous in that two chips need to be accurately positioned within the same plane, which increases the possibility of measurement precision loss of the sensor caused by misalignment.

Through modification of the design of the ferromagnetic reference layer within a multi-layer film structure, push and pull magnetoresistive sensing units with opposite ferromagnetic reference layers can be manufactured by changing the number of layers of a multi-layer film composed of ferromagnetic layers and metal spacing layers exchange coupled to an anti-ferromagnetic layer, wherein one multi-layer film has an odd number of layers and the other has an even number of layers. This approach is disadvantageous in that the complexity of the process is increased as at least two kinds of multi-layer film structures need to be introduced in the deposition of the multi-layer films.

In a method for annealing a magnetic field using laser programmed heating as disclosed in the Chinese Patent Application No. CN201610821610.7, magnetoresistive sensing units are scanned and an anti-ferromagnetic layer is rapidly heated to a temperature above the blocking temperature; and meanwhile, a magnetic field can be applied in any direction during the cooling process to set orientations of magnetic field sensing directions of the magnetoresistive sensing units in any direction by scanning them one by one, or even chip by chip. Four kinds of orthogonally oriented magnetoresistive sensing units of double-axis magnetoresistive sensing units on a single chip and their arrays can be manufactured using the method, so that the difficulty of precise positioning of the flipped chip and complexity of micromachining process of depositing various magnetic multi-layer film structures can be overcome, and a single-chip dual-axis magnetoresistive angle sensor can be produced in batches.

SUMMARY OF THE INVENTION

In order to solve the above technical problems, a single-chip high-sensitivity magnetoresistive linear sensor is proposed in the present invention, wherein the magnetic field sensing directions of magnetoresistive sensing units are set by laser assisted magnetic field annealing.

The single-chip high-sensitivity magnetoresistive linear sensor proposed in the present invention comprises:
a substrate located in the X-Y plane;
a soft ferromagnetic flux concentrator array located on the substrate, wherein the soft ferromagnetic flux concentrator array comprises several soft ferromagnetic flux concentrators, there is a gap between each two adjacent soft ferromagnetic flux concentrators, the long axis of the gap is in the Y direction, and the short axis of the gap is in the X direction; and
a +X magnetoresistive sensing unit array and a −X magnetoresistive sensing unit array located above or below the soft ferromagnetic flux concentrator array, the +X magnetoresistive sensing unit array and the −X magnetoresistive sensing unit array respectively comprising +X magnetoresistive sensing units and −X magnetoresistive sensing units located in the gaps of the soft ferromagnetic flux concentrators, wherein the +X magnetoresistive sensing unit array is electrically interconnected to form an X push arm, the −X magnetoresistive sensing unit array is electrically interconnected to form an X pull arm, and the X push arm and the X pull arm are electrically interconnected to form a push pull X-axis magnetoresistive sensor,
wherein each of the magnetoresistive sensing units that have the same magnetic field sensing direction are arranged in adjacent locations, the magnetoresistive sensing units each have the same magnetic multi-layer film structure comprising a seed layer, a lower electrode layer, an anti-ferromagnetic layer, a pinning layer, Ru, a reference layer, a nonmagnetic interlayer, a free layer, a magnetic bias layer, an upper electrode layer, and a passivation layer from the bottom up or comprising a seed layer, a lower electrode layer, an anti-ferromagnetic layer, a reference layer, a nonmagnetic interlayer, a free layer, a magnetic bias layer, an upper electrode layer, and a passivation layer from the bottom up, wherein the nonmagnetic interlayer is $Al_2O_3$ or MgO, the magnetic bias layer is a hard magnetic layer, another anti-ferromagnetic layer, or a synthetic anti-ferromagnetic layer structure, the passivation layer is a material transparent to laser, and wherein the magnetoresistive sensing unit array is scanned by laser spot using laser programmed magnetic annealing in the Y direction of the long axis of the gap, and the magnetic field of the soft ferromagnetic flux concentrator array is amplified for laser annealing an X-direction external magnetic field of the anti-ferromagnetic layer.

Preferably, magnetic field sensing directions of the +X magnetoresistive sensing unit array and the −X magnetoresistive sensing unit array are in +X and −X directions respectively, the long axes of the +X and −X magnetoresistive sensing unit arrays are in the Y direction, and the magnetoresistive sensing units are all MTJ magnetoresistive sensor elements each in an elliptic shape, or a shape with a rectangular middle portion and two triangular or fan-shaped end portions respectively located on two opposite sides of the middle portion.

Further, the soft ferromagnetic flux concentrator is elongated, the long axis of the soft ferromagnetic flux concentrator is in the Y direction, the short axis is in the X direction, the length is 500-5000 μm, the width is 500-5000 μm, the thickness is 5-30 μm, the width of the gap is 6.5-10 μm, and the soft ferromagnetic flux concentrator is a high-permeability soft ferromagnetic alloy comprising one or more elements of Fe, Co, and Ni.

Further, the strength of the X-direction external magnetic field is Hex, the magnetoresistive sensing units have the same X-direction magnetic field strength Brx with a magnetic field gain factor of $Brx/(\mu_0 *Hex)$, wherein $\mu_0$ denotes a vacuum permeability, the magnetic field gain factor ranges between 1 and 10; and wherein the soft ferromagnetic flux concentrator array has the same gap, and the width of the soft ferromagnetic flux concentrators on two ends is greater than that of the soft ferromagnetic flux concentrators located between the soft ferromagnetic flux concentrators on the two ends, so that the gaps at the two ends and the gap in the middle position have the same magnetic field gain factor.

Further, the soft ferromagnetic flux concentrator array comprises N soft ferromagnetic flux concentrators, wherein N is an integer greater than 0, when N is an odd number, the magnetoresistive sensing unit array is distributed in N−1 gaps on two sides of the $(N+1)/2^{th}$ soft ferromagnetic flux concentrator; and when N is an even number, the magnetoresistive sensing unit array is distributed in gaps between the $1^{st}$ to $N/2^{th}$ soft ferromagnetic flux concentrators and the $N/2+1^{th}$ to $N^{th}$ soft ferromagnetic flux concentrators.

Further, the push pull magnetoresistive linear sensor is of a half-bridge, full-bridge or quasi-bridge structure.

Further, single-row magnetoresistive sensing units are distributed in the gaps of the soft ferromagnetic flux concentrators; or double-row magnetoresistive sensing units are distributed in the gaps of the soft ferromagnetic flux concentrators and each equidistantly distributed on two sides of a centerline of the gaps of the soft ferromagnetic flux concentrators.

Further, the +X magnetoresistive sensing unit array and the −X magnetoresistive sensing unit array are distributed on two sides of the X-direction centerline or two sides of the Y-direction centerline of the soft ferromagnetic flux concentrator array.

Further, the +X magnetoresistive sensing unit array constituting two push arms and the −X magnetoresistive sensing unit array constituting two pull arms of the push pull magnetoresistive sensor are spatially separated or spatially mixed, respectively, and the magnetoresistive sensing units comprised in the magnetoresistive sensing unit arrays are connected in series, connected in parallel, or connected in series and in parallel to form a two-port structure.

Further, the passivation layer is a material transparent to ultraviolet laser or a material transparent to infrared laser, wherein the material transparent to ultraviolet laser comprises BCB, $Si_3N_4$, $Al_2O_3$, $HfO_2$, $AlF_3$, $GdF_3$, $LaF_3$, $MgF_2$, $Sc_2O_3$, $HfO_2$, and $SiO_2$, and the material transparent to infrared laser comprises a diamond-like carbon film, MgO, SiN, SiC, $AlF_3$, $MgF_2$, $SiO_2$, $Al_2O_3$, $ThF_4$, ZnS, ZnSe, $ZrO_2$, $HfO_2$, $TiO_2$, $Ta_2O_7$, Si, and Ge.

Further, the surface of the passivation layer is coated with an anti-reflective coating.

Compared with the prior art, the prevent invention is advantageous in small size, high precision and low power consumption.

BRIEF DESCRIPTION OF THE DRAWINGS

FIG. 5(*a*1), FIG. 5(*a*2), FIG. 5(*a*3) and FIG. 5(*b*1), FIG. 5(*b*2), FIG. 5(*b*3) are partially enlarged diagrams of six different situations that can be used at A in FIG. 4 respectively;

DETAILED DESCRIPTION

In order to illustrate the technical solution in embodiments of the present invention or in the prior art more clearly, the accompanying drawings needing to be used in the descriptions about the embodiments or the prior art will be introduced briefly in the following. It is apparent that the accompanying drawings in the following descriptions are merely some embodiments of the present invention. Those of ordinary skill in the art can also obtain other accompanying drawings according to the accompanying drawings without creative efforts.

Figure 1:
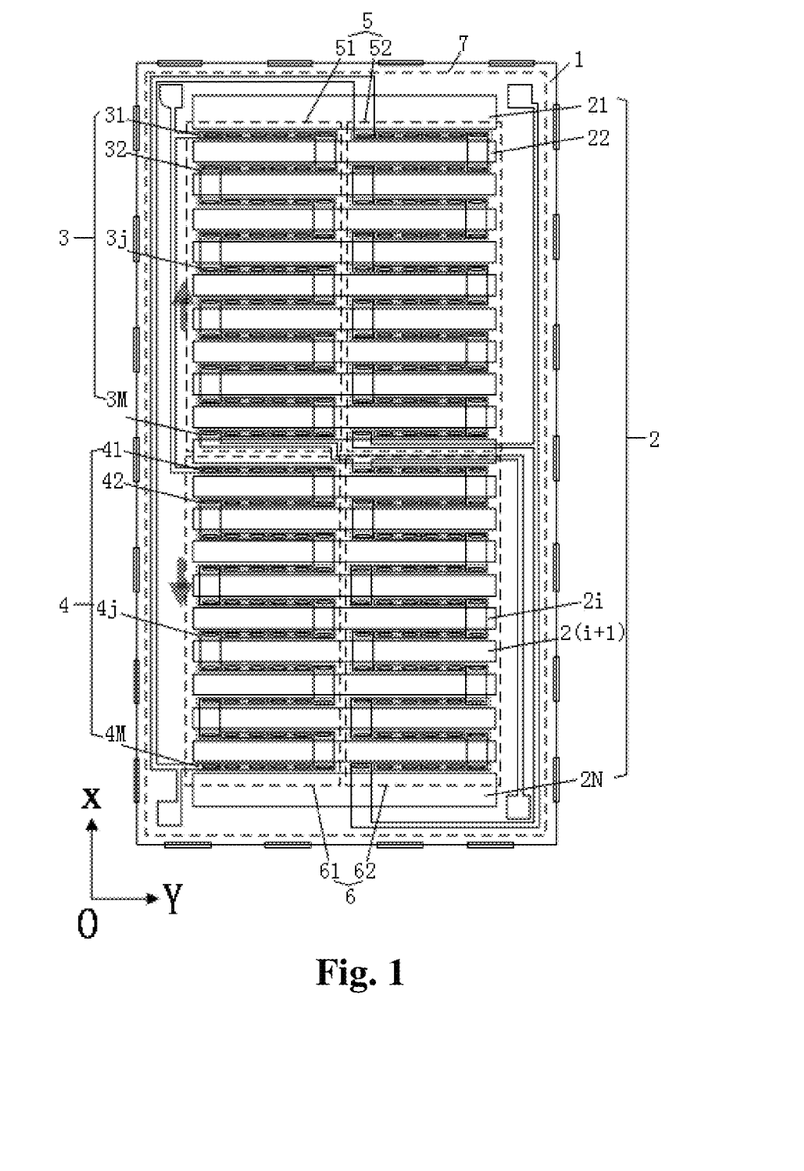
FIG. 1 is a structural diagram of a single-chip high-sensitivity magnetoresistive linear sensor.

FIG. 1 is a structural diagram of a single-chip high-sensitivity magnetoresistive linear sensor, including:

a substrate 1 located in the X-Y plane;

a soft ferromagnetic flux concentrator array 2 located on the substrate 1, wherein the soft ferromagnetic flux concentrator array includes N elongated soft ferromagnetic flux concentrators 21, 22, . . . , 2N, there is a gap correspondingly between each two adjacent soft ferromagnetic flux concentrators 2*i* and 2(*i*+1), wherein i is a positive integer less than N, the long axis of the gap is in the Y direction, and the short axis of the gap is in the X direction; and a +X magnetoresistive sensing unit array 3 and a −X magnetoresistive sensing unit array 4 with magnetic field sensing directions in +X and −X respectively, the +X magnetoresistive sensing unit array 3 comprising +X magnetoresistive sensing units 31, 32, . . . , 3j, . . . , 3M, the −X magnetoresistive sensing unit array 4 comprising −X magnetoresistive sensing units 41, 42, . . . , 4j, . . . , 4M, wherein j is a positive integer less than M. The +X magnetoresistive sensing units and the −X magnetoresistive sensing units are located in the gaps formed by the soft ferromagnetic flux concentrator array 2 respectively. The +X and −X magnetoresistive sensing unit arrays are electrically interconnected to form a +X push arm 5 and a −X pull arm 6 respectively. FIG. 1 shows a full bridge structure including two +X push arms 51 and 52 and two −X pull arms 61 and 62, and the push arm 5 and the pull arm 6 are electrically interconnected to form a push pull X-axis magnetoresistive sensor 7.

Figure 2:
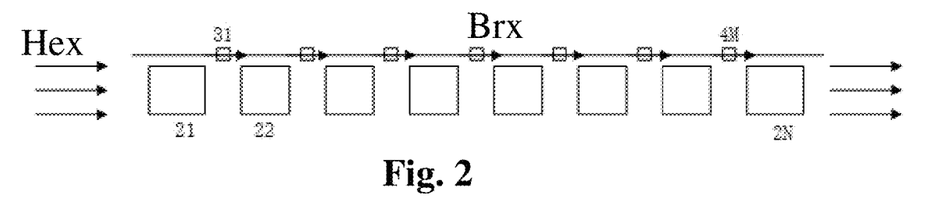
FIG. 2 is a positional diagram of a soft ferromagnetic flux concentrator array and a magnetoresistive sensing unit array.
Figure 3:
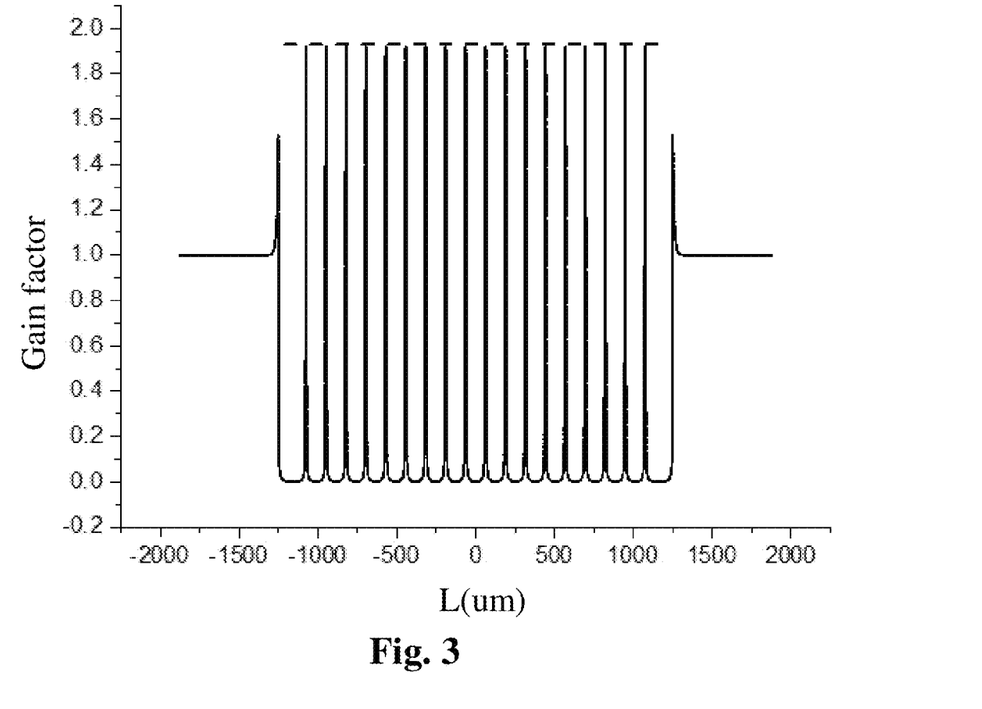
FIG. 3 is a diagram showing magnetic field gain at positions of the magnetoresistive sensing units of the soft magnetic flux concentrator under the action of an external magnetic field.

FIG. 2 is a positional diagram of magnetoresistive sensing units and soft ferromagnetic flux concentrators in an external magnetic field. The +X magnetoresistive sensing unit array 3 and the −X magnetoresistive sensing unit array 4 are located above or below the soft ferromagnetic flux concentrator array 2 and are centered in the gaps of two adjacent soft ferromagnetic flux concentrators. Under the action of an external magnetic field Hex, the X-direction magnetic field strength at the magnetoresistive sensing unit is Brx, and a magnetic field gain factor is $Brx/(\mu_0 * Hex)$, wherein $\mu_0$ denotes a vacuum permeability, the magnetic field gain factor ranges between 1 and 10. A distribution curve is shown in FIG. 3. The soft ferromagnetic flux concentrator array has the same gap, and all the magnetoresistive sensing units have the same magnetic field gain factor. The width of the soft ferromagnetic flux concentrators on the two ends is increased, so that the gap at the two ends and the gap in the middle position have the same magnetic field gain factor.

The soft ferromagnetic flux concentrator is elongated, the long axis and the short axis there are in the Y direction and the X direction respectively, the length is 500-5000 μm, the width is 500-5000 μm, the thickness is 5-30 μm, the width of the gap is 6.5-10 μm, and the soft ferromagnetic flux concentrator is a high-permeability soft ferromagnetic alloy including one or more elements of Fe, Co, and Ni.

Figure 4:
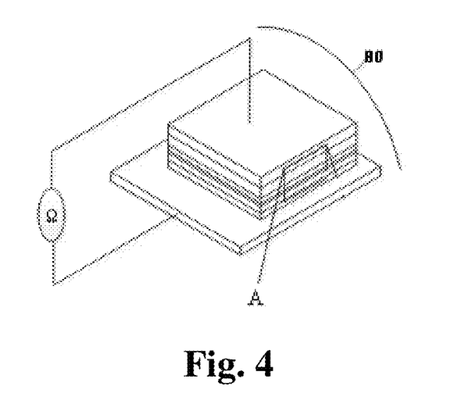
FIG. 4 is a diagram showing a multi-layer film structure of an MTJ magnetoresistive sensor element.
Figure 5:
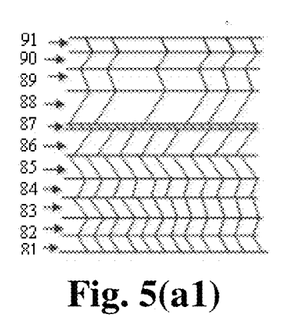

FIG. 4 is a schematic diagram of a magnetic multi-layer film structure of a magnetoresistive sensing unit. Referring to FIG. 5(a1) to FIG. 5(a3) and FIG. 5(b1) to FIG. 5(b3), the magnetoresistive sensing unit is an MTJ element, including an upper electrode 91, a lower electrode 82, and a seed layer 81, and in addition, further including a ferromagnetic reference layer 86, a non-magnetic isolation layer 87, and a ferromagnetic free layer 88. The non-magnetic isolation layer is $Al_2O_3$ or MgO. The ferromagnetic reference layer 87 and the ferromagnetic free layer 88 are configured with orthogonal magnetization directions. The magnetization direction of the ferromagnetic reference layer 86 is determined by exchange coupling with an anti-ferromagnetic layer 83. There are two exchange coupling structures. One is exchange coupling of the anti-ferromagnetic layer 83/pinning layer 84/Ru/ferromagnetic reference layer, wherein the magnetization direction of the pinning layer 84 is determined by the anti-ferromagnetic layer 83, the pinning layer 84 and the ferromagnetic reference layer 86 have opposite magnetization directions. The other one is direct coupling between the anti-ferromagnetic layer 83 and the ferromagnetic reference layer 86, of which the magnetization direction is determined by 83. The magnetization direction of the ferromagnetic free layer 88 is determined in three manners.

The first manner is direct coupling of another anti-ferromagnetic layer 89 shown in FIG. 5(a1), the second manner is exchange coupling by the anti-ferromagnetic layer/another pinning layer 89/Ru/the ferromagnetic free layer 88 shown in FIG. 5(a2), and the third manner is magnetic field biasing of a hard magnetic layer 94 shown in FIG. 5(a3). In the three cases, the magnetization directions of the anti-ferromagnetic layer 89 and the hard magnetic layer 94 are both perpendicular to that of the anti-ferromagnetic layer 83 to obtain the orthogonality of magnetization directions of the free layer and the ferromagnetic reference layer. Therefore, there are three manners of pinning the free layer and two manners of pinning the reference layer, and thus there are six combinations in total.

The passivation layer is a material transparent to ultraviolet laser including BCB, $Si_3N_4$, $Al_2O_3$, $HfO_2$, $AlF_3$, $GdF_3$, $LaF_3$, $MgF_2$, $Sc_2O_3$, $HfO_2$, and $SiO_2$, or a material transparent to infrared laser including a diamond-like carbon film, MgO, SiN, SiC, $AlF_3$, $MgF_2$, $SiO_2$, $Al_2O_3$, $ThF_4$, ZnS, ZnSe, $ZrO_2$, $HfO_2$, $TiO_2$, $Ta_2O_7$, Si, and Ge. The surface of the passivation layer is coated with an anti-reflective coating.

Figure 6A:
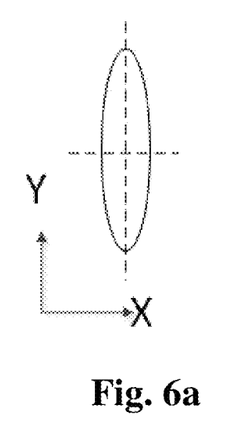
FIG. 6*a* and FIG. 6*b* are shape diagrams of the MTJ magnetoresistive sensor element.
Figure 6B:
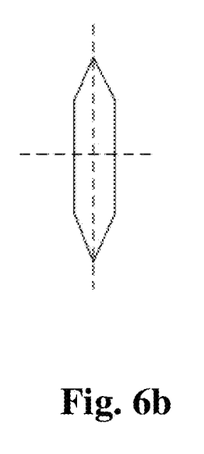

The +X magnetoresistive sensing units and the −X magnetoresistive sensing units may be MTJ magnetoresistive sensor elements. FIG. 6 is a shape diagram of the MTJ magnetoresistive sensor elements. They are in two shapes, one is an elliptic shape, and the other is a shape with a rectangular middle portion and two triangular or fan-shaped end portions respectively located on two opposite sides of the middle portion. The magnetization direction of the free layer is inclined to the direction of the long axis by shape anisotropy, so that it is perpendicular to the magnetization direction of the pinning layer in the direction of the short axis.

Figure 7:
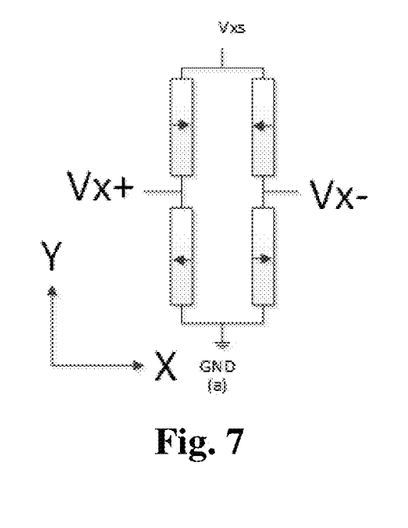
FIG. 7 is a structural diagram of a push-pull magnetoresistive sensor full-bridge.

The push arm and the pull arm can be connected to form a half bridge, full bridge or quasi bridge. FIG. 7 is a schematic structural diagram of a magnetoresistive full bridge.

Figure 8:
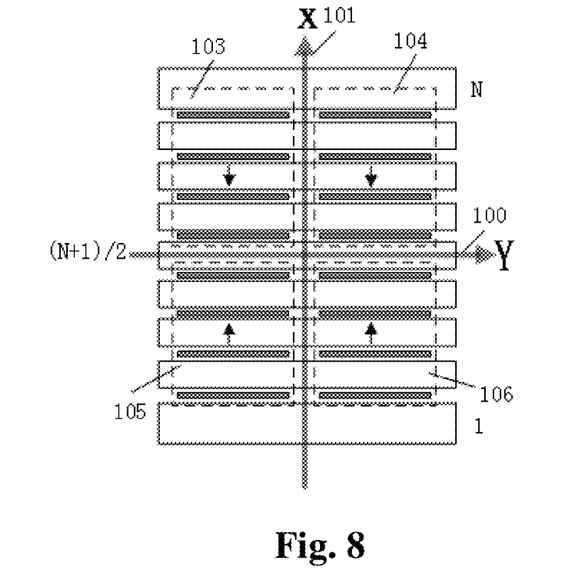
FIG. 8 is a first arrangement diagram of +X and −X magnetoresistive sensing unit arrays and flux concentrators.
Figure 9:
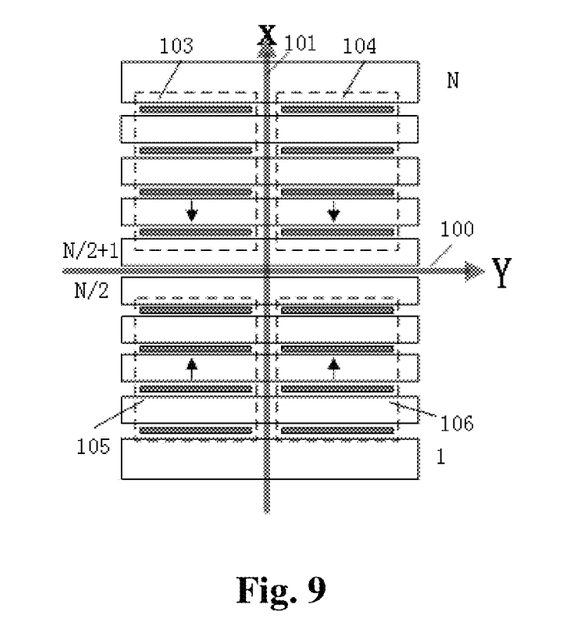
FIG. 9 is a second arrangement diagram of the +X and −X magnetoresistive sensing unit arrays and the flux concentrators.

FIG. 8 and FIG. 9 are arrangement diagram of the magnetoresistive sensing units when the number N of the soft ferromagnetic flux concentrators included in the soft ferromagnetic flux concentrator array is an odd number or an even number. When the number of the soft ferromagnetic flux concentrators is an odd number, the magnetoresistive sensing units are distributed in the gaps on two sides of the $(N+1)/2^{th}$ soft ferromagnetic flux concentrator, as shown in FIG. 8. In other words, each gap corresponds to a row of magnetoresistive sensing units respectively. When the number of the soft ferromagnetic flux concentrators is an even number, the magnetoresistive sensing unit arrays are distributed in gaps between the $1^{st}$ to $N/2^{th}$ soft ferromagnetic flux concentrators and the $N/2+1^{th}$ to $N^{th}$ soft ferromagnetic flux concentrators, as shown in FIG. 9. In other words, except for the middlemost gap (that is, the gap formed between the $N/2^{th}$ and the $N/2+1^{th}$ soft ferromagnetic flux concentrators), other gaps each correspond to a row of magnetoresistive sensing units.

Figure 10:
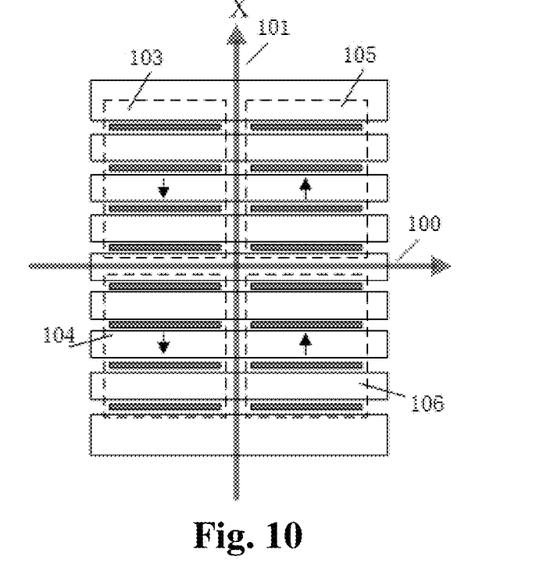
FIG. 10 is a third arrangement diagram of the +X and −X magnetoresistive sensing unit arrays and the flux concentrators.
Figure 11:
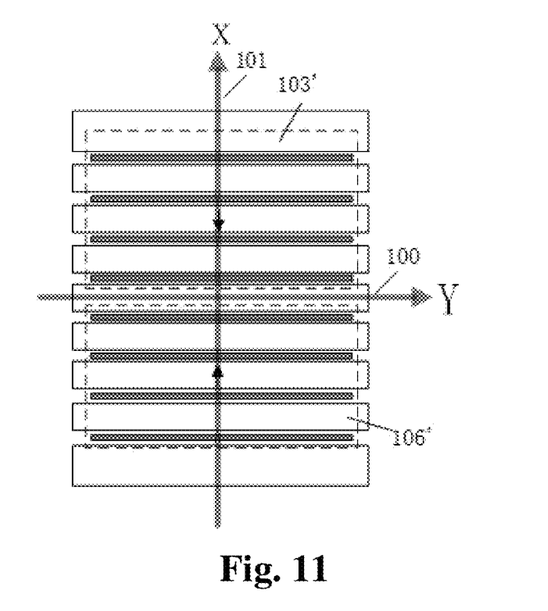
FIG. 11 is a fourth arrangement diagram of the +X and −X magnetoresistive sensing unit arrays and the flux concentrators.

FIG. 8 to FIG. 11 show four arrangement manners of the push-pull magnetoresistive sensing unit arrays. In FIG. 8 and FIG. 9, push magnetoresistive sensing unit arrays 103 and 104 are symmetric to pull magnetoresistive sensing unit arrays 105 and 106 relative to a Y-axis centerline 100 of the soft ferromagnetic flux concentrator array respectively. In addition, the same kind of magnetoresistive sensing unit arrays, for example, 103 and 104 as well as 105 and 106, are symmetric to each other relative to an X-axis centerline 101 respectively. In FIG. 10, the push magnetoresistive sensing unit arrays 103 and 104 are symmetric to the pull magnetoresistive sensing unit arrays 105 and 106 relative to the X-axis centerline respectively, and the two identical push magnetoresistive sensing unit arrays 103 and 104 and the two identical pull magnetoresistive sensing unit arrays 105 and 106 are symmetric to each other relative to the Y-axis centerline respectively. FIG. 11 shows a third arrangement manner, in which the two identical push or pull magnetoresistive sensing unit arrays are mixed into an array 103' or 106', and then are symmetrically arranged about the Y-axis centerline 100 or the X-axis centerline 101.

Figure 12:
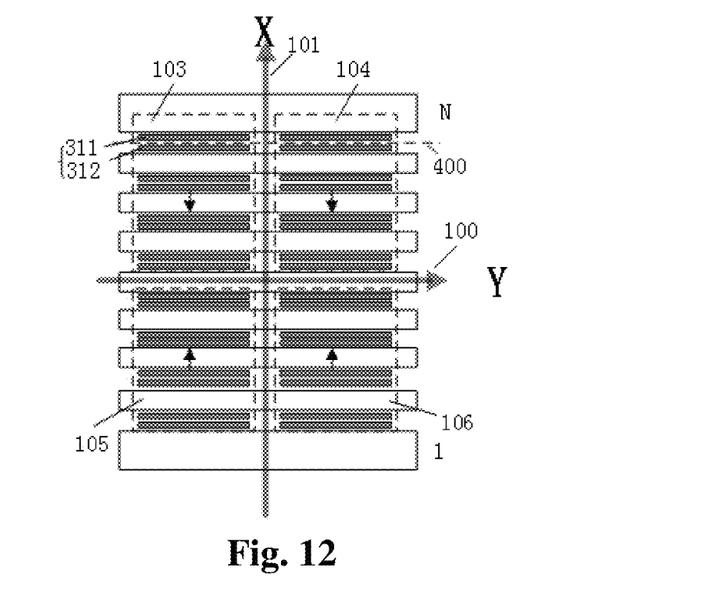
FIG. 12 is a first arrangement diagram of +X and −X magnetoresistive sensing unit double-row arrays and the flux concentrators.
Figure 13:
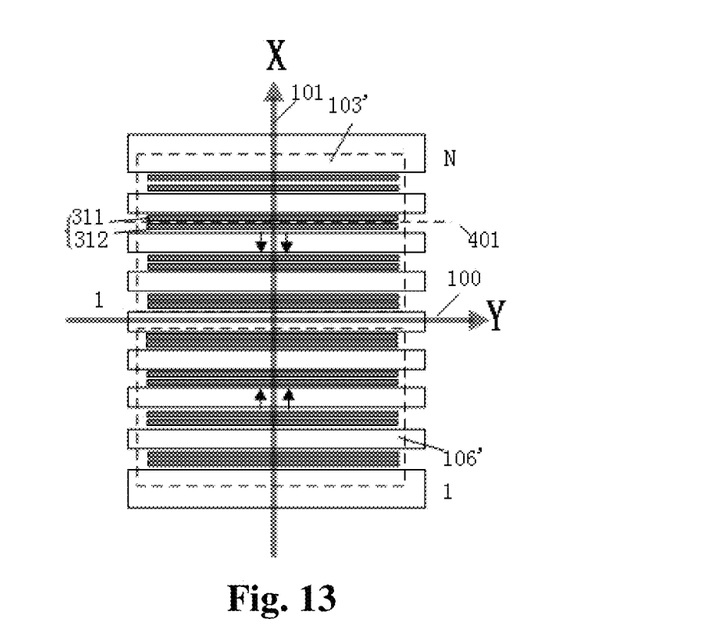
FIG. 13 is a second arrangement diagram of the +X and −X magnetoresistive sensing unit double-row arrays and the flux concentrators.

FIG. 12 and FIG. 13 show double-row arrangement manners of the magnetoresistive sensing units in the gaps of the soft ferromagnetic flux concentrator array. Magnetoresistive sensing unit rows 311 and 312 are located at the same gap and at the same distance relative to gap midlines 400 and 401 to ensure that they have the same magnetic field gain factor. FIG. 12 shows an arrangement manner in which two magnetoresistive sensing unit arrays of the same type are symmetric relative to the X-axis centerline. FIG. 13 shows an arrangement manner in which two magnetoresistive sensing unit arrays of the same type are mixed. The magnetoresistive sensing units included in the magnetoresistive sensing unit arrays are connected in series, connected in parallel or connected in series and in parallel to form a two-port structure.

Figure 14:
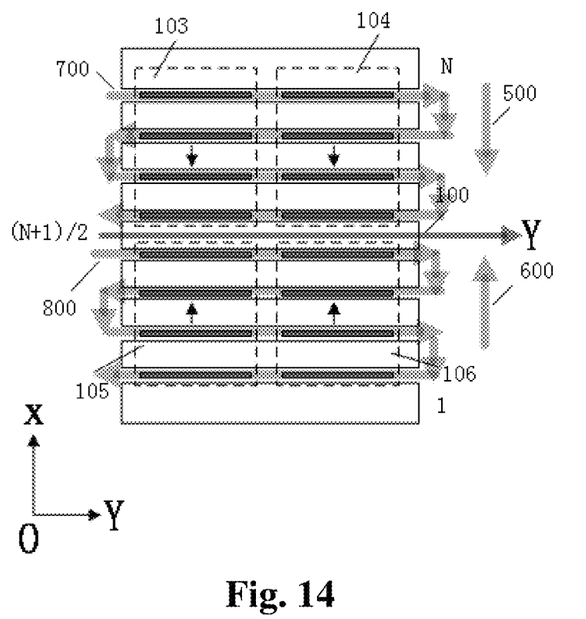
FIG. 14 shows a typical laser magnetic annealing scanning method of the +X and −X magnetoresistive sensing unit arrays.

FIG. 14 shows a typical laser magnetic annealing scanning manner of the +X and −X magnetoresistive sensing unit arrays. 103 and 104 denote magnetoresistive sensing unit arrays in the +X magnetic field sensing direction, 105 and 106 denote magnetoresistive sensing unit arrays in the −X magnetic field sensing direction, and they are symmetrically distributed in the gaps relative to the Y-axis centerline of the soft ferromagnetic flux concentrator. During scanning, the magnetoresistive sensing unit arrays are scanned in the gap direction respectively along laser spot paths 700 and 800, respectively, thus saving the time required by the scanning. 500 and 600 denote directions of an external magnetic field applied for magnetic field annealing, which can be enhanced by the gain effect of the soft ferromagnetic flux concentrator array.

All other embodiments obtained by those of ordinary skill in the art based on the embodiments in the present invention without creative efforts all fall within the protection scope of the present invention. Although the present invention is illustrated and described in terms of preferred implementations, it should be appreciated by those skilled in the art that various changes and modifications can be made to the present invention as long as the changes and modifications do not go beyond the scope defined by the claims of the present invention.

The invention claimed is:

1. A single-chip high-sensitivity magnetoresistive linear sensor, comprising:
a substrate located in the X-Y plane defined by an X-axis in an X direction and a Y-axis in a Y direction;
a soft ferromagnetic flux concentrator array located on the substrate, wherein the soft ferromagnetic flux concentrator array comprises several soft ferromagnetic flux concentrators, and there is a gap between each two adjacent soft ferromagnetic flux concentrators, wherein the gap has a long axis in the Y direction and a short axis in the X direction; and
a +X magnetoresistive sensing unit array and a −X magnetoresistive sensing unit array located above or below the soft ferromagnetic flux concentrator array, the +X magnetoresistive sensing unit array and the −X magnetoresistive sensing unit array respectively comprising +X magnetoresistive sensing units and −X magnetoresistive sensing units located in the gaps of the soft ferromagnetic flux concentrators, wherein the +X magnetoresistive sensing unit array is electrically interconnected to form an X push arm, the −X magnetoresistive sensing unit array is electrically interconnected to form an X pull arm, and the X push arm and the X pull arm are electrically interconnected to form a push pull X-axis magnetoresistive sensor,
wherein each of the magnetoresistive sensing units that have the same magnetic field sensing direction are arranged in adjacent locations, the magnetoresistive sensing units each having the same magnetic multilayer film structure comprising a seed layer, a lower electrode layer, an anti-ferromagnetic layer, a pinning layer, Ru, a reference layer, a nonmagnetic interlayer, a free layer, a magnetic bias layer, an upper electrode layer, and a passivation layer from the bottom up or comprising a seed layer, a lower electrode layer, an anti-ferromagnetic layer, a reference layer, a nonmagnetic interlayer, a free layer, a magnetic bias layer, an upper electrode layer, and a passivation layer from the bottom up, wherein the nonmagnetic interlayer is $Al_2O_3$ or MgO, the magnetic bias layer is a hard magnetic layer, another anti-ferromagnetic layer, or a synthetic anti-ferromagnetic layer structure, the passivation layer is a material transparent to laser, and wherein the magnetoresistive sensing unit array is scanned by laser spot using laser programmed magnetic annealing in the Y direction of the long axis of the gap, and the magnetic field of the soft ferromagnetic flux concentrator array is amplified for laser annealing an X-direction external magnetic field of the anti-ferromagnetic layer.

2. The single-chip high-sensitivity magnetoresistive linear sensor according to claim 1, wherein magnetic field sensing directions of the +X magnetoresistive sensing unit array and the −X magnetoresistive sensing unit array are in +X and −X directions respectively, the long axes of the +X and −X magnetoresistive sensing unit arrays are in the Y direction, and the magnetoresistive sensing units are all magnetic tunnel junction (MTJ) magnetoresistive sensor elements each in an elliptic shape, or a shape with a rectangular middle portion and two triangular or fan-shaped end portions respectively located on two opposite sides of the middle portion.

3. The single-chip high-sensitivity magnetoresistive linear sensor according to claim 1, wherein the soft ferromagnetic flux concentrator is elongated, the long axis of the soft ferromagnetic flux concentrator is in the Y direction, the short axis is in the X direction, the length is 500-5000 μm, the width is 500-5000 μm, the thickness is 5-30 μm, the width of the gap is 6.5-10 μm, and the soft ferromagnetic flux concentrator is a high-permeability soft ferromagnetic alloy comprising one or more elements of Fe, Co, and Ni.

4. The single-chip high-sensitivity magnetoresistive linear sensor according to claim 1, wherein the strength of the X-direction external magnetic field is Hex, the magnetoresistive sensing units have the same X-direction magnetic field strength Brx with a magnetic field gain factor of $Brx/(\mu_0 * Hex)$, wherein $\mu_0$ denotes a vacuum permeability, the magnetic field gain factor ranges between 1 and 10; and wherein the soft ferromagnetic flux concentrator array has the same gap, and the width of the soft ferromagnetic flux concentrators on two ends is greater than that of the soft ferromagnetic flux concentrators located between the soft ferromagnetic flux concentrators on the two ends, so that the gaps at the two ends and the gap in the middle position have the same magnetic field gain factor.

5. The single-chip high-sensitivity magnetoresistive linear sensor according to claim 1, wherein the soft ferromagnetic flux concentrator array comprises N soft ferromagnetic flux concentrators, wherein N is an integer greater than 0,
when N is an odd number, the magnetoresistive sensing unit array is distributed in N−1 gaps on two sides of the $(N+1)/2^{th}$ soft ferromagnetic flux concentrator; and
when N is an even number, the magnetoresistive sensing unit array is distributed in gaps between the $1^{st}$ to $N/2^{th}$ soft ferromagnetic flux concentrators and the $N/2+1^{th}$ to $N^{th}$ soft ferromagnetic flux concentrators.

6. The single-chip high-sensitivity magnetoresistive linear sensor according to claim 1, wherein the push pull magnetoresistive linear sensor is of a half-bridge, full-bridge or quasi-bridge structure.

7. The single-chip high-sensitivity magnetoresistive linear sensor according to claim 1, wherein single-row magnetoresistive sensing units are distributed in the gaps of the soft ferromagnetic flux concentrators; or double-row magnetoresistive sensing units are distributed in the gaps of the soft ferromagnetic flux concentrators and each equidistantly distributed on two sides of a centerline of the gap of the soft ferromagnetic flux concentrators.

8. The single-chip high-sensitivity magnetoresistive linear sensor according to claim 1, wherein the +X magnetoresistive sensing unit array and the −X magnetoresistive sensing unit array are distributed on two sides of the X-direction centerline or two sides of the Y-direction centerline of the soft ferromagnetic flux concentrator array.

9. The single-chip high-sensitivity magnetoresistive linear sensor according to claim 1, wherein the +X magnetoresistive sensing unit array constituting two push arms and the −X magnetoresistive sensing unit array constituting two pull arms of the push pull magnetoresistive sensor are spatially separated or spatially mixed, respectively, and the magnetoresistive sensing units comprised in the magnetoresistive sensing unit arrays are connected in series, connected in parallel, or connected in series and in parallel to form a two-port structure.

10. The single-chip high-sensitivity magnetoresistive linear sensor according to claim 1, wherein the surface of the passivation layer is coated with an anti-reflective coating, the passivation layer is a material transparent to ultraviolet laser or a material transparent to infrared laser, wherein the material transparent to ultraviolet laser comprises BCB, $Si_3N_4$, $Al_2O_3$, $HfO_2$, $AlF_3$, $GdF_3$, $LaF_3$, $MgF_2$, $Sc_2O_3$, $HfO_2$, and $SiO_2$, and the material transparent to infrared laser comprises a diamond-like carbon film, MgO, SiN, SiC, $AlF_3$, $MgF_2$, $SiO_2$, $Al_2O_3$, $ThF_4$, ZnS, ZnSe, $ZrO_2$, $HfO_2$, $TiO_2$, $Ta_2O_7$, Si, and Ge.

* * * * *